(12) United States Patent
Kang et al.

(10) Patent No.: US 7,026,649 B2
(45) Date of Patent: Apr. 11, 2006

(54) THIN FILM TRANSISTOR AND ACTIVE MATRIX FLAT PANEL DISPLAY USING THE SAME

(75) Inventors: Tae-Wook Kang, Seongnam-si (KR); Chang-Yong Jeong, Suwon-si (KR); Choong-Youl Im, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/930,896

(22) Filed: Aug. 31, 2004

(65) Prior Publication Data

US 2005/0045887 A1    Mar. 3, 2005

(30) Foreign Application Priority Data

Sep. 3, 2003    (KR)    ............... 10-2003-0061589

(51) Int. Cl.
   *H01L 29/04*    (2006.01)
(52) U.S. Cl. ............... 257/72; 257/59; 257/66
(58) Field of Classification Search ............ 257/59, 257/66, 72
   See application file for complete search history.

(56) References Cited

U.S. PATENT DOCUMENTS

| | | | |
|---|---|---|---|
| 5,668,379 A * | 9/1997 | Ono et al. | 257/59 |
| 6,365,917 B1 * | 4/2002 | Yamazaki | 257/72 |
| 6,445,004 B1 * | 9/2002 | Jeong et al. | 257/59 |
| 6,512,271 B1 * | 1/2003 | Yamazaki et al. | 257/350 |
| 6,515,336 B1 * | 2/2003 | Suzawa et al. | 257/350 |
| 6,534,789 B1 * | 3/2003 | Ishida | 257/72 |
| 6,759,678 B1 * | 7/2004 | Yamazaki et al. | 257/59 |
| 6,809,339 B1 | 10/2004 | Suzawa et al. | |
| 6,825,488 B1 * | 11/2004 | Yamazaki et al. | 257/40 |

FOREIGN PATENT DOCUMENTS

| | | |
|---|---|---|
| JP | 2001-255543 | 9/2001 |
| JP | 2002-83805 | 3/2002 |
| KR | 1998-0005705 | 3/1998 |
| KR | 2000-0003756 | 1/2000 |

OTHER PUBLICATIONS

Patent Abstracts of Japan for Publication number: 2001-255543; Date of publication of application Sep. 21, 2001, in the name to T. Kaneko et al.

Patent Abstracts of Japan for Publication number: 2002-083805; Date of publication of application Mar. 22, 2002, in the name of H. Suzawa et al.

Korean Patent Abstracts for Publication numbe: 1020000003756; Date of publication of application Jan. 25, 2000, in the name of D. Lee et al.

* cited by examiner

*Primary Examiner*—Gene M. Munson
(74) *Attorney, Agent, or Firm*—Christie, Parker and Hale, LLP

(57) ABSTRACT

A thin film transistor and an active matrix flat panel device. By forming a conductive material layer having multiple profiles, critical dimension (CD) bias is reduced and step coverage is enhanced. The thin film transistor includes the conductive material layer formed on an insulating substrate, wherein the conductive material layer is composed of at least one thin film transistor conductive material layer, and an edge portion of the conductive material layer is composed of multiple profiles with multiple edge taper angles.

14 Claims, 5 Drawing Sheets

THIN FILM TRANSISTOR AND ACTIVE MATRIX FLAT PANEL DISPLAY USING THE SAME

CROSS-REFERENCE TO RELATED APPLICATION

This application claims priority to and the benefit of Korean Patent Application No. 2003-61589, filed Sep. 3, 2003 with the Korean Intellectual Property Office, the disclosure of which is hereby incorporated herein by reference in its entirety.

BACKGROUND OF THE INVENTION

1. Field of the Invention

The present invention relates to a thin film transistor and an active matrix flat panel display using the same and, more particularly, to a thin film transistor and an active matrix flat panel device in which, by forming a conductive layer having multiple profiles, critical dimension (CD) bias is reduced and step coverage is enhanced.

2. Description of the Related Art

Generally, in an active matrix flat panel display, unit pixels are formed on an array substrate thereof, the unit pixels being in a matrix form in which a plurality of gate lines and a plurality of data lines are crossed. A thin film transistor, which is a switching and driving element, is formed on each pixel region.

Such an array substrate is formed through a plurality of mask processes. In particular, a conductive layer, such as a gate line, a data line, or the like, is formed using a low resistive metal, such as aluminum (Al), molybdenum (Mo), molybdenum-tungsten (MoW), or the like.

FIG. 1 is a cross-sectional view showing a conventional active matrix flat panel display. FIGS. 2 and 3 are sectional scanning electron microscope (SEM) photographs of a conventional active matrix flat panel display.

Referring to FIG. 1, active layer 120 of a polysilicon layer is formed on insulating substrate 100 on which buffer layer 110 is formed. Gate insulating layer 130 and a gate metal are deposited on an entire surface of the substrate, and the gate metal is patterned to form gate electrode 140. Impurity doping is made using gate electrode 140 as a mask to form source region 121 and drain region 125. A region in active layer 120 between source region 121 and drain region 125 acts as channel region 123.

Thereafter, interlayer insulating layer 150 is deposited and patterned to form contact holes 151, 155 which expose portions of source region 121 and drain region 125. A metal layer is deposited on the entire surface of insulating substrate 100 and is then subject to photolithography using photoresist as a mask such that source and drain electrodes 161, 165 and metal wiring 167 are formed. At this time, the width of metal wiring 167 depends on the resolution of a panel, and is generally 2 μm or more.

After source and drain electrodes 161, 165 and metal wiring 167 have been formed, passivation layer 170 is formed on the entire surface of insulating substrate 100, via hole 175 is formed on the passivation layer, the via hole exposing a portion of either source electrode 161 or drain electrode 165, for example, drain electrode 165, and pixel electrode 180 of the flat panel display is formed which is electrically connected to drain electrode 165 through via hole 175.

Subsequently, although not shown in the figure, the flat panel display is formed by a typical fabricating method for a flat panel display.

In the flat panel display formed through such processes, however, taper angle α of an edge portion of the conductive layer, such as gate electrode 140, source and drain electrodes 161, 165, metal wiring 167 or pixel electrode 180, is small, and for example from about 45° to 50°, as in FIG. 2. Critical dimension (CD) bias, namely, a difference between before and after the conductive layer, such as gate electrode 140, source and drain electrodes 161, 165, metal wiring 167, and pixel electrode 180, is etched reaches to about 0.7 μm. This is because the conductive layer is etched by performing an etching process under a condition of high retreat rate of the photoresist and, at the same time, the photoresist itself is also etched and retreated, so-called over-etched. Thus, in case of a small edge taper angle α, it is difficult to control the critical dimension (CD) bias. That is, there is a significant difference between the CDs before and after the conductive layer, such as gate electrode 140, source and drain electrodes 161, 165, metal wiring 167, and pixel electrode 180, is etched.

In the case where the CD bias is large as described above, there is a problem in that the conductive layer is formed to have its width smaller than a given width, which increases the resistance of the conductive layer.

In order to solve the above-stated problem, a method has been introduced in which the conductive layer is formed by etching the conductive layer under a condition of low retreat rate of the photoresist.

When forming the conductive layer using the etching process under the condition of the low photoresist retreat rate, edge taper angle α' becomes large, to 80° or more, which makes it possible to form a conductive layer with its small CD bias and its width closed to a given width, as shown in FIG. 3. However, there is a problem in that the step coverage of a subsequently formed layer becomes deteriorated due to large edge taper angle α'.

That is, the edge taper angle of the conductive layer, such as gate electrode 140, source and drain electrodes 161, 165, metal wiring 167, and pixel electrode 180, acts as a factor determining the step coverage and voltage-current characteristic of a subsequently formed layer and, therefore, there is a problem in that if the edge taper angle becomes larger than a given angle, the step coverage becomes poor while if the edge taper angle becomes smaller than the given angle, the CD bias becomes larger and accordingly the resistance of the conductive layer increases, resulting in a deteriorated voltage-current characteristic.

SUMMARY OF THE INVENTION

In accordance with the present invention a thin film transistor and an active matrix flat panel display are provided in which CD bias is reduced and step coverage is excellent by forming a conductive layer having multiple profiles.

According to an aspect of the present invention, there is provided a thin film transistor including a conductive layer formed on an insulating substrate, wherein the conductive layer is composed of at least one conductive material layer, and an edge portion of the conductive layer is composed of multiple profiles with multiple edge taper angles.

According to another aspect of the present invention, there is also provided a flat panel display including a conductive layer formed on an insulating substrate, wherein the conductive layer is composed of at least one conductive material layer, and an edge portion of the conductive layer is composed of multiple profiles with multiple edge taper angles.

In an exemplary embodiment of the present invention, the conductive layer is at least one of a gate electrode, source and drain electrodes, a gate line, a data line, a power line and a pixel electrode.

In another exemplary embodiment a bottom edge taper angle of the multiple edge taper angles include a bottom edge taper angle of about 60° to 90° and the other edge taper angles gradually reduced in an upward direction, any one of the other edge taper angles having a range between one fourth and three fourths of an adjacent large edge taper angle.

In a further exemplary embodiment the conductive layer is composed of a dual profile of a first edge taper angle and a second edge taper angle, the first edge taper angle being 60° to 90° and the second edge taper angle being 30° to 60°.

In an exemplary embodiment a thickness of a portion having the second edge taper angle is between one fourth and three fourths of the thickness of the conductive layer.

In yet another exemplary embodiment the conductive layer is composed of at least two conductive material layers, and the edge taper angle of one of conductive layers with the exception of a bottom conductive layer among the at least two conductive material layers is between one fourth and three fourths of the edge taper angle of an adjacent lower conductive material layer.

In a yet further exemplary embodiment the conductive layer is composed of a first conductive material layer and a second conductive material layer formed on the first conductive material layer, the edge taper angle of the first conductive material layer being 60° to 90° and the edge taper angle of the second conductive material layer being 30° to 60°.

In still another exemplary embodiment the thickness of the second conductive material layer is between one fourth and three fourths of the thickness of the conductive layer.

BRIEF DESCRIPTION OF THE DRAWINGS

In the drawings, the thickness of layers and regions are exaggerated for clarity. Like numbers refer to like elements throughout the specification.

DETAILED DESCRIPTION OF THE INVENTION

Figure 1:
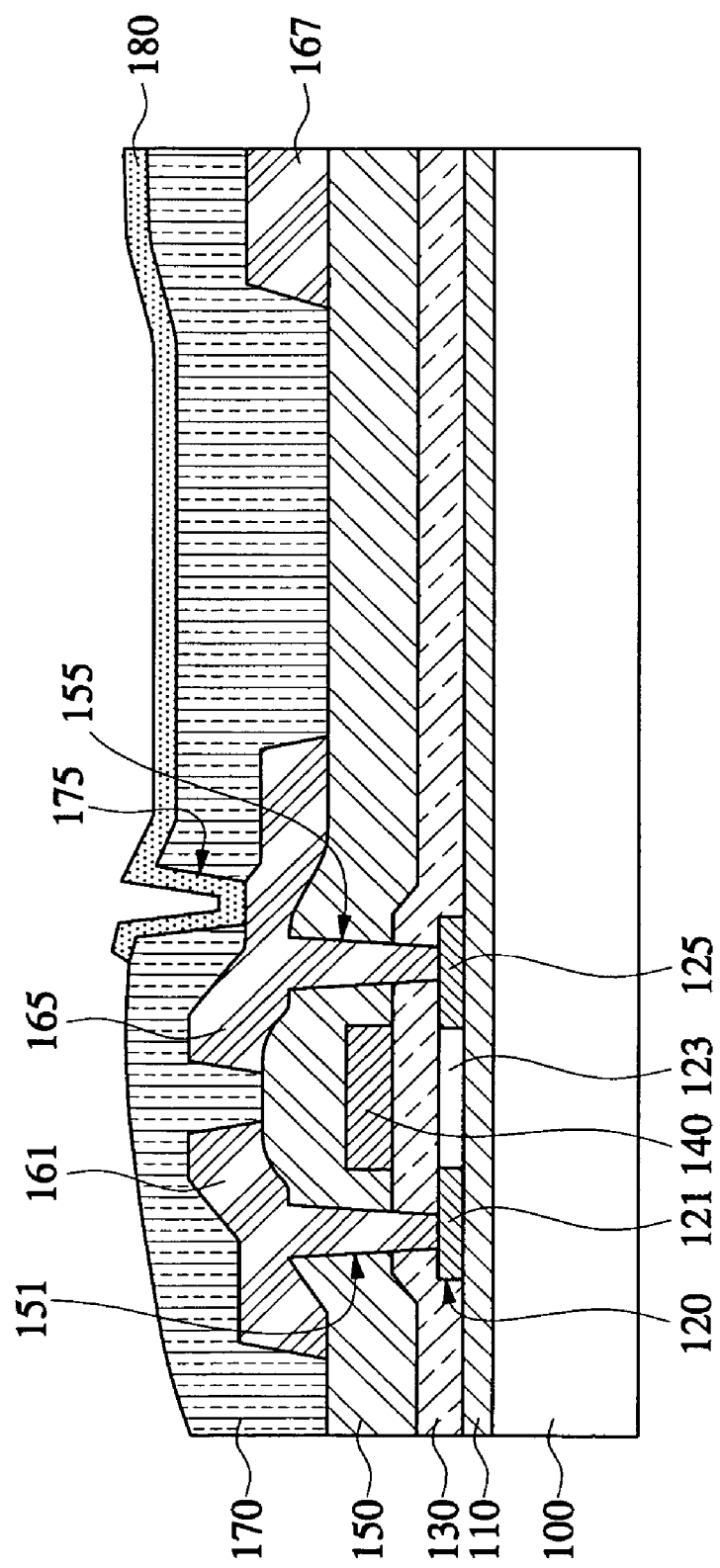
FIG. 1 is a cross-sectional view showing a conventional active matrix flat panel display.
Figure 2:
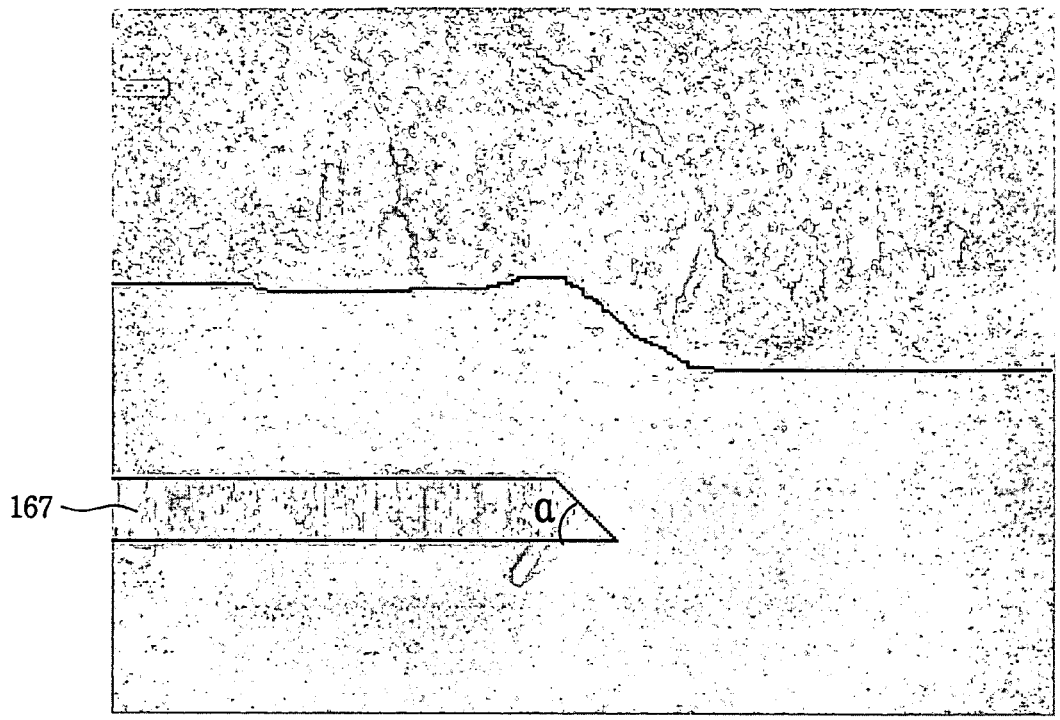
FIGS. 2 and 3 are sectional SEM photographs of a conventional active matrix flat panel display.
Figure 3:
Figure 4:
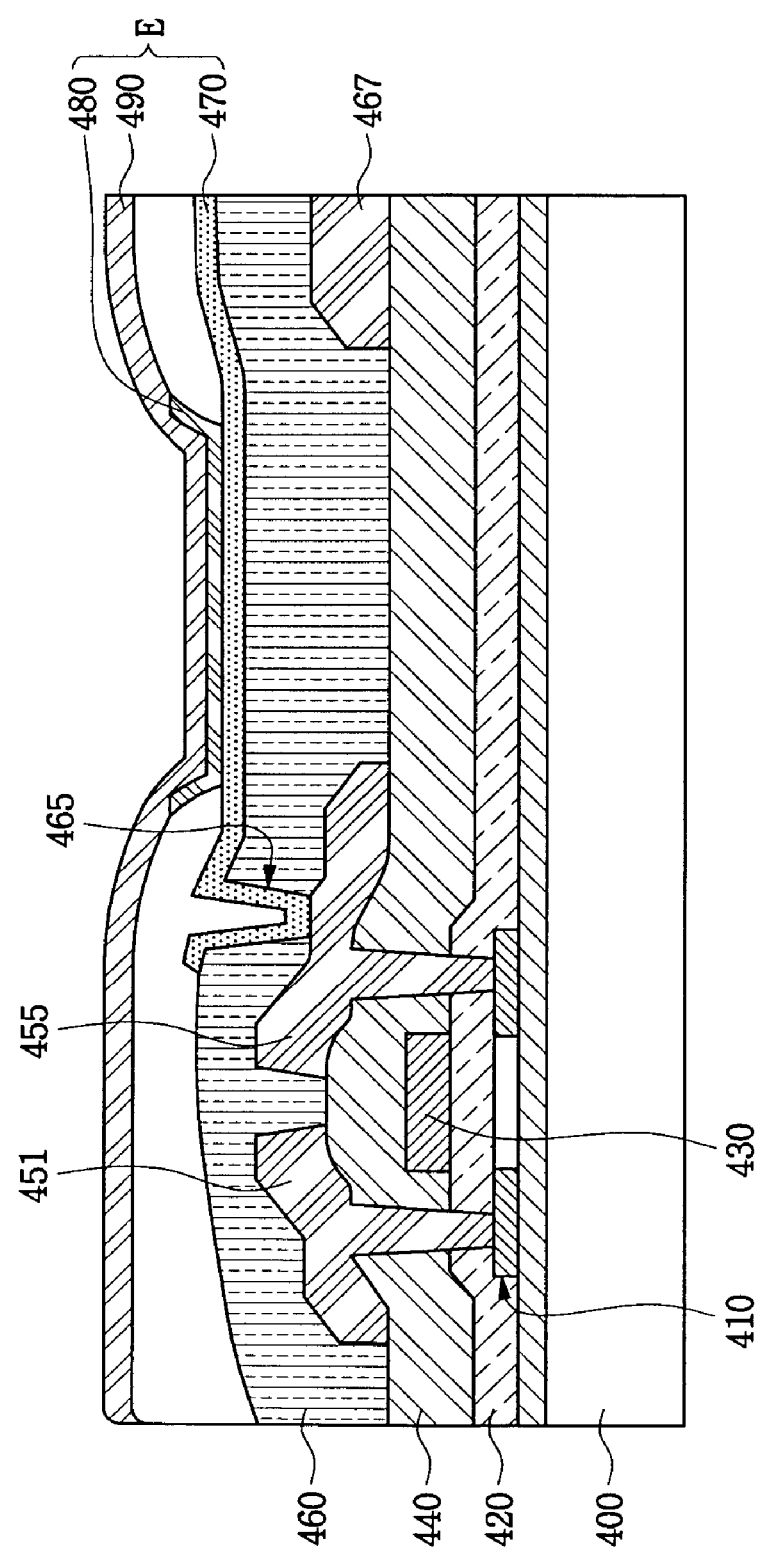
FIG. 4 is a cross-sectional view of an active matrix flat panel display according to an exemplary embodiment of the present invention.

FIG. 4 is a cross-sectional view of an active matrix flat panel display comprising thin film transistors according to an exemplary embodiment of the present invention. In FIG. 4, the active matrix flat panel display comprises thin film transistors, each including active layer 410 formed on a pixel portion of insulating substrate 400, gate electrode 430 formed on gate insulating layer 420, and source and drain electrodes 451 and 455 formed on interlayer insulating layer 440, in which metal wiring 467, such as a gate line, a data line, and the like formed on an array portion, is formed. Further, it comprises passivation layer 460 in which via hole 465 is formed on insulating substrate 400 including the thin film transistor and metal wiring 467, the via hole exposing portions of source and drain electrodes 451, 455 of the thin film transistor; and electroluminescent element E electrically connected to either source electrode 451 or drain electrode 455, for example, drain electrode 455 through via hole 465.

In FIG. 4, an organic electroluminescent display is shown as an example of electroluminescent element E, the organic electroluminescent display being composed of pixel electrode 470, organic electroluminescent layer 480, and upper electrode 490.

The conductive layer, such as gate electrode 430, source and drain electrodes 451, 455, metal wiring 467, or pixel electrode 470, is formed in the form of a dual profile having first edge taper angle $\alpha''$ and second edge taper angle $\alpha'''$, thereby reducing the CD bias and enhancing the step coverage of subsequent formed insulating layers, namely, interlayer insulating layer 440 and passivation layer 460.

Figure 5A:
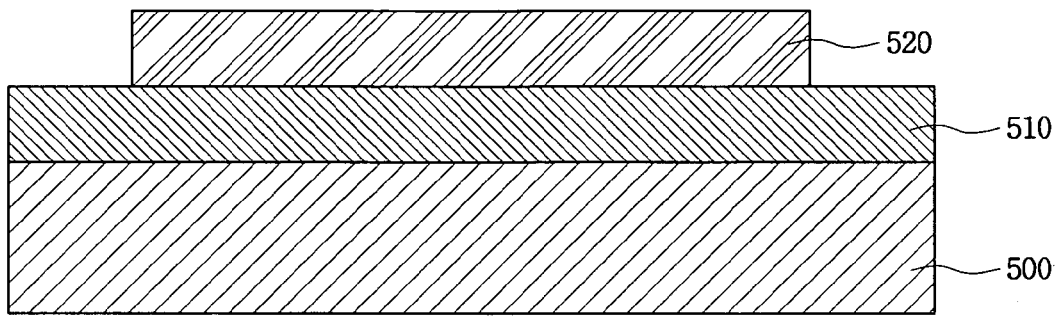
FIGS. 5a to 5c are process sectional views forming a dual profile of a metal wiring in an active matrix flat panel display according to an embodiment of the present invention.
Figure 5B:
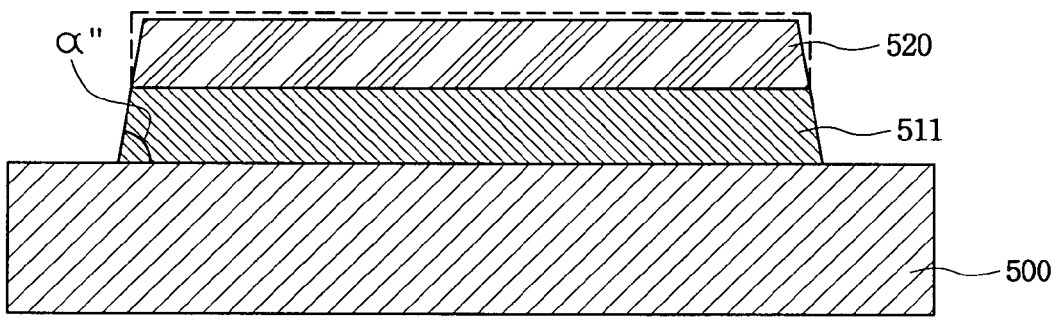
Figure 5C:
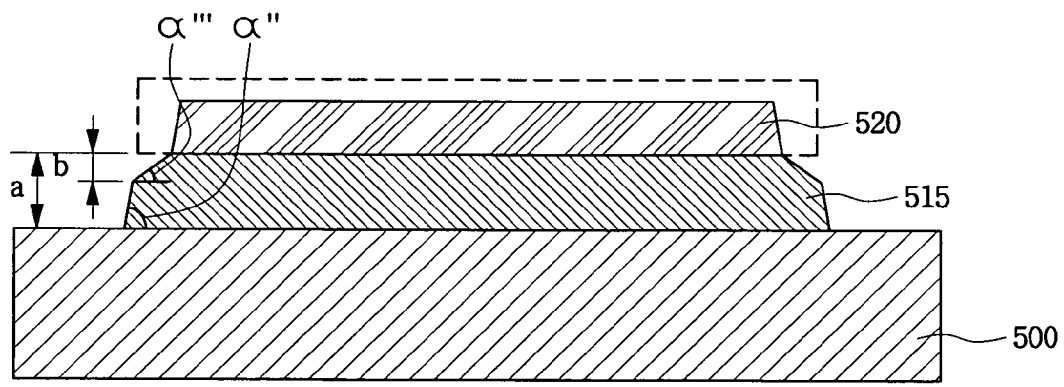

FIGS. 5a to 5c are process sectional views in which a dual profile is formed for a conductive layer in a thin film transistor and a flat panel display according to an exemplary embodiment of the present invention.

Referring to FIG. 5a, conductive layer 510 is formed on insulating substrate 500 to form a gate electrode, source and drain electrodes, a gate line, a data line, a power line, a pixel electrode, or the like. At this time, the conductive layer is generally formed to have a thickness of 200 Å or more.

After forming conductive layer 510, depositing, exposing and developing photoresist, photoresist pattern 520 for patterning conductive layer 510 is formed.

Referring to FIG. 5b, a first etching process is performed using photoresist pattern 520 as a mask under a condition of low retreat rate of photoresist pattern 520, so that conductive layer 511 with first edge taper angle $\alpha''$ of a large angle is formed. In one exemplary embodiment first edge taper angle $\alpha''$ is 60° to 90°. It is intended to reduce the loss due to the wiring resistance by making the CD bias of conductive layer 511 to be small.

Referring to FIG. 5c, second edge taper angle $\alpha'''$ of a small angle is formed on an edge portion of conductive layer 511 by performing a second etching process on conductive layer 511 with first edge taper angle $\alpha''$ under an etching condition of a high retreat rate of photoresist pattern 520, such that a dual profile of conductive layer 515 composed of first edge taper angle $\alpha''$ and second edge taper angle $\alpha'''$ is formed. In another exemplary embodiment second edge taper angle $\alpha'''$ is 30° to 60°. That is, a bottom edge taper angle of the multiple edge taper angles includes a bottom edge taper angle of about 60° to 90° and the other edge taper angles gradually reduced in an upward direction, any one of the other edge taper angles having a range between one fourth and three fourths of an adjacent large edge taper angle.

In a further exemplary embodiment thickness b of a portion in which second edge taper angle $\alpha'''$ is formed is between one fourth and three fourths of total thickness a of conductive layer 515. This is intended to enhance the step coverage of a subsequently formed layer. When thickness b of the portion in which second edge taper angle α''' is formed becomes two thirds or more of thickness a of conductive layer 515, it is difficult to control the CD bias, and the resulting CD bias is increased together with the resistance of conductive layer 515 and thus a voltage-current characteristic is deteriorated.

Figure 6:
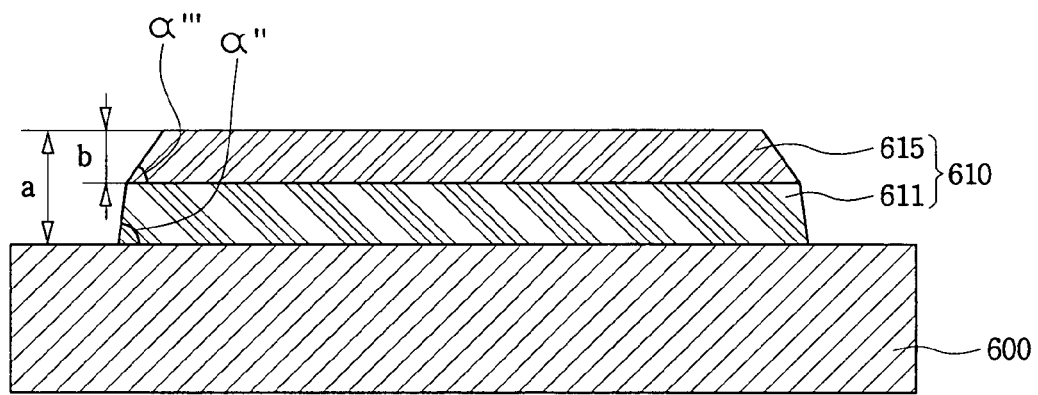
FIG. 6 is a cross-sectional view for explaining multiple profiles of a conductive layer applied to a thin film transistor and a flat panel display according to another embodiment of the present invention.

FIG. 6 is a cross-sectional view for explaining multiple profiles of a conductive layer which is applied to a thin film transistor and a flat panel display according to another embodiment of the present invention. Conductive layer 610 of the thin film transistor shown in FIG. 6 is similar to that of the thin film transistor shown in FIG. 5. However, there is a difference between them in that conductive layer 610 is formed of a plurality of conductive material layers, for example, a two-layer structure of first and second conductive material layers 611, 615.

Referring to FIG. 6, conductive layer 610, composed of first conductive material layer 611 and second conductive material layer 615, is formed on insulating substrate 600 to form a gate electrode, source and drain electrodes, a gate line, a data line, a power line, a pixel electrode, or the like.

First conductive material layer 611 and second conductive material layer 615 are formed to have prescribed edge taper angles α'' and α''', respectively.

In an exemplary embodiment edge taper angle α'' of first conductive material layer 611 is 60° to 90° and edge taper angle α''' of second conductive material layer 615 is 30° to 60°.

In yet another exemplary embodiment thickness b of second conductive material layer 615 is between one fourth and three fourths of total thickness a of conductive layer 610 composed of first and second conductive material layers 611, 615.

This is intended to reduce the loss due to wiring resistance by making the CD bias of conductive layer 610 to be small and, at the same time, to enhance the step coverage of the following processes, similarly to the conductive layer shown in FIG. 5.

Figure 7:
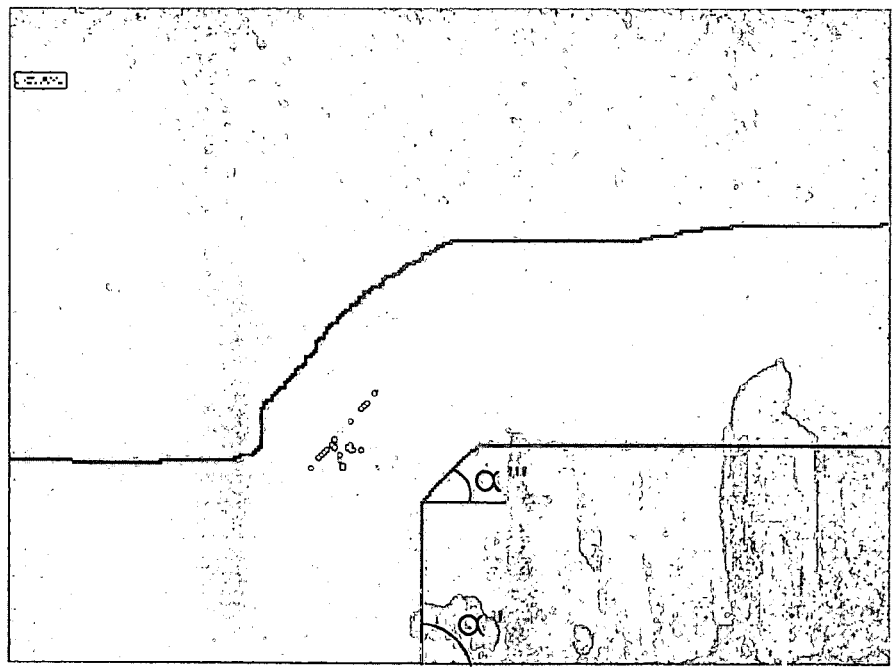
FIG. 7 is a sectional SEM photograph of an active matrix flat panel display according to an exemplary embodiment of the present invention.

FIG. 7 is a cross-sectional SEM photograph of an active matrix flat panel display according to an embodiment of the present invention. In FIG. 7, a conductive layer of the flat panel display according to an exemplary embodiment of the present invention has a dual profile which comprises first edge taper angle α'' maintaining a large angle and second edge taper angle α''' maintaining a small angle.

Therefore, according to the exemplary embodiment of the present invention, the conductive layer has small CD bias and accordingly small loss due to the wiring resistance, which makes the step coverage of a subsequently formed passivation layer to be excellent.

Although the conductive layer, such as the gate electrode, the source and drain electrodes, the gate line, the data line, the power line, or the pixel electrode, has been described by way of example in the embodiment of the present invention, a contact hole or a via hole of an insulating layer, or the like can be also formed to have multiple profiles.

According to the present invention, by forming the conductive layer with multiple profiles, it is possible to provide a thin film transistor and a flat panel display in which step coverage is excellent and a voltage drop due to increased wiring resistance caused by the CD bias is small.

It will be understood by those skilled in the art that the foregoing description has depicted several embodiments of the invention and that various changes and modifications may be made in the invention without departing from the spirit and scope of the invention defined in the appended claims

What is claimed is:

1. A thin film transistor comprising:
   an active conductive layer a source region and a drain region;
   a gate conductive layer insulated from the active conductive layer, the gate conductive layer patterned to form a gate electrode;
   an insulating layer deposited on the gate conductive layer and patterned to form contact holes to the respective source region and drain region;
   a metal conductive layer deposited on the insulating layer forming a source electrode, a drain electrode and metal wiring; and
   a passivation layer formed on the metal conductive layer and including a via hole formed on the passivation layer and exposing a portion of the drain region;
   wherein one or more of the active conductive layer, the gate conductive layer, or the metal conductive layer, includes at least one conductive material layer having multiple edge portion profiles with multiple edge taper angles.

2. The thin film transistor of claim 1, wherein the multiple edge taper angles include a lower part taper angle and upper part taper angle of about 60° to 90° and other edge taper angles gradually reduced in a layer-above direction, any one of the other edge taper angles having a range between one fourth and three fourths of an adjacent lower edge taper angle.

3. The thin film transistor according to claim 2, wherein the at least one conductive material layer is composed of a dual profile of a first edge taper angle and a second edge taper angle, the first edge taper angle being 60° to 90° and the second edge taper angle being 30° to 60°.

4. The thin film transistor according to claim 3, wherein the thickness of a portion having the second edge taper angle is between one fourth and three fourths of the thickness of the at least one conductive material layer.

5. The thin film transistor according to claim 1, wherein the at least one conductive material layer is composed of at least two conductive material layers, an edge taper angle of one of the at least two conductive material layers, other than a bottom conductive material layer, being between one half and two thirds of the edge taper angle of an adjacent lower conductive material layer.

6. The thin film transistor according to claim 5, wherein the at least one conductive material layer is composed of a first thin film transistor conductive material layer and a second thin film transistor conductive material layer formed on the first thin film transistor conductive material layer, the edge taper angle of the first thin film transistor conductive material layer being 60° to 90° and the edge taper angle of the second thin film transistor conductive material layer being 30° to 60°.

7. The thin film transistor according to claim 6, wherein the thickness of the second thin film transistor conductive material layer is between one fourth and three fourths of the thickness of the at least one conductive material layer.

8. An active matrix flat panel display apparatus comprising:
   a thin film transistor for a pixel region of an active matrix flat panel display, the thin film transistor having:
   an active conductive layer formed on an insulating substrate, the active layer providing a source region, a drain region and a channel region between the source region and the drain region;

a gate conductive layer insulated from the active conductive layer, the gate conductive layer patterned to form a gate electrode;

an insulating layer deposited on the gate conductive layer and patterned to form contact holes to the respective source region and drain region;

a metal layer is deposited on the insulating layer forming source and drain electrodes and metal wiring; and a passivation layer formed on the metal layer and including a via hole formed on the passivation layer and exposing a portion of the drain region;

wherein one or more of the active conductive layer, the gate electrode layer, or the metal layer, includes at least one conductive material layer having multiple edge portion profiles with multiple edge taper angles;

a pixel electrode formed to electrically connect to the drain region through the via hole; and an electroluminescent element electrically connected to the pixel electrode.

9. The active matrix flat panel display apparatus of claim 8, wherein the multiple edge taper angles include a lower part taper angle and upper part taper angle of about 60° to 90° and other edge taper angles gradually reduced in a layer-above direction, any one of the other edge taper angles having a range between one fourth and three fourths of an adjacent lower edge taper angle.

10. The active matrix flat panel display apparatus according to claim 9, wherein the at least one conductive material layer is composed of a dual profile of a first edge taper angle and a second edge taper angle, the first edge taper angle being 60° to 90° and the second edge taper angle being 30° to 60°.

11. The active matrix flat panel display apparatus according to claim 10, wherein the thickness of a portion having the second edge taper angle is between one fourth and three fourths of the thickness of the at least one conductive material layer.

12. The active matrix flat panel display apparatus according to claim 8, wherein the at least one conductive material layer is composed of at least two conductive material layers, an edge taper angle of one of the at least two conductive material layers, other than a bottom conductive material layer, being between one half and two thirds of the edge taper angle of an adjacent lower conductive material layer.

13. The active matrix flat panel display apparatus according to claim 12, wherein the at least one conductive material layer is composed of a first thin film transistor conductive material layer and a second thin film transistor conductive material layer formed on the first thin film transistor conductive material layer, the edge taper angle of the first thin film transistor conductive material layer being 60° to 90° and the edge taper angle of the second thin film transistor conductive material layer being 30° to 60°.

14. The active matrix flat panel display apparatus according to claim 13, wherein the thickness of the second thin film transistor conductive material layer is between one fourth and three fourths of the thickness of the at least one conductive material layer.

* * * * *

UNITED STATES PATENT AND TRADEMARK OFFICE
CERTIFICATE OF CORRECTION

PATENT NO. : 7,026,649 B2  Page 1 of 1
APPLICATION NO. : 10/930896
DATED : April 11, 2006
INVENTOR(S) : Kang et al.

It is certified that error appears in the above-identified patent and that said Letters Patent is hereby corrected as shown below:

In the Claims

Column 6, line 6, Claim 1     After "layer",
                              Insert --,--

Signed and Sealed this

Twelfth Day of December, 2006

JON W. DUDAS
*Director of the United States Patent and Trademark Office*